US006093519A

United States Patent [19]

[11] Patent Number: 6,093,519

[45] Date of Patent: Jul. 25, 2000

Rompuy et al.

[54] HEAT SENSITIVE IMAGING ELEMENT AND A METHOD FOR PRODUCING LITHOGRAPHIC PLATES THEREWITH

[75] Inventors: Ludo Van Rompuy, Mortsel; Peter Ceyssens, Diest; Luc Leenders, Herentals, all of Belgium

[73] Assignee: Agfa-Gevaert, N.V.

[21] Appl. No.: 09/081,573

[22] Filed: May 19, 1998

Related U.S. Application Data

[60] Provisional application No. 60/053,185, Jul. 17, 1997.

[30] Foreign Application Priority Data

Jun. 5, 1997 [EP] European Pat. Off. .............. 97201682

[51] Int. Cl.$^7$ .............................. G03F 7/004

[52] U.S. Cl. .............................. 430/303

[58] Field of Search .............................. 430/270.1, 944, 430/945, 303

[56] References Cited

U.S. PATENT DOCUMENTS

| | | | |
|---|---|---|---|
| 4,010,687 | 3/1977 | Schank et al. | 101/453 |
| 4,012,254 | 3/1977 | Crystal . | |
| 4,259,905 | 4/1981 | Abiko et al. | 101/467 |
| 4,686,138 | 8/1987 | Toyama et al. | 428/323 |

FOREIGN PATENT DOCUMENTS

| | | |
|---|---|---|
| 0 755 803 A1 | 1/1997 | European Pat. Off. . |
| 1 387 542 | 3/1975 | United Kingdom . |
| WO 97/00175 | 1/1997 | WIPO . |

OTHER PUBLICATIONS

Patent Abstracts of Japan, vol. 012, No. 227 (M–713), Jun. 28, 1988 and JP 63 022687 A (Toppan Printing Co Ltd), Jan. 30, 1988.

Research Disclosure, Feb. 1974, pp. 24–28, XP002019315.

*Primary Examiner*—Janet Baxter
*Assistant Examiner*—Barbara Gilmore
*Attorney, Agent, or Firm*—Breiner & Breiner

[57] ABSTRACT

According to the present invention there is provided a heat sensitive recording material having on a support a recording layer containing a homogeneous ink accepting phase and an ink abhesive phase, characterized in that said ink abhesive phase comprises a silicon based polymer.

8 Claims, No Drawings

HEAT SENSITIVE IMAGING ELEMENT AND A METHOD FOR PRODUCING LITHOGRAPHIC PLATES THEREWITH

The application claims the benefit of U.S. Provisional Application No. 60/053,185 filed Jul. 17,1997.

DESCRIPTION

1. Field of the Invention

The present invention relates to a heat sensitive recording material for making a lithographic printing plate for use in lithographic printing without dampening. The present invention further relates to a method for imaging said heat sensitive recording material by means of a laser.

2. Background of the Invention

Lithographic printing is the process of printing from specially prepared surfaces, some areas of which are capable of accepting ink (oleophilic areas) whereas other areas will not accept ink (oleophobic areas). The oleophilic areas form the printing areas while the oleophobic areas form the background areas.

Two basic types of lithographic printing plates are known. According to a first type, so called wet offset printing plates, both water or an aqueous dampening liquid and ink are applied to the plate surface that contains hydrophilic and hydrophobic areas. The hydrophilic areas will be soaked with water or the dampening liquid and are thereby rendered oleophobic while the hydrophobic areas will accept the ink. A second type of lithographic offset printing plates operates without the use of a dampening liquid and are called driographic printing plates. This type of printing plates comprises highly ink repellant areas and oleophilic areas. Generally the highly ink repellant areas consist of a silicon layer.

Driographic printing plates can be prepared using a photographic material that is made image-wise receptive or repellant to ink upon photo-exposure of the photographic material. However heat sensitive recording materials, the surface of which can be made image-wise receptive or repellant to ink upon image-wise exposure to heat and/or subsequent development are also known for preparing driographic printing plates.

For example in DE-A-2512038 there is disclosed a heat sensitive recording material that comprises on a support carrying or having an oleophilic surface (i) a heat sensitive recording layer containing a self oxidizing binder e.g. nitrocellulose and a substance that is capable of converting radiation into heat e.g. carbon black and (ii) a non-hardened silicon layer as a surface layer. The disclosed heat sensitive recording material is image-wise exposed using a laser and is subsequently developed using a developing liquid that is capable of dissolving the silicon layer in the exposed areas. Subsequent to this development the silicon surface layer is cured. Due to the use of naphta as a developing liquid the process is ecologically disadvantageous. Further since the surface layer is not hardened the heat sensitive recording material may be easily damaged during handling.

FR-A-1.473.751 discloses a heat sensitive recording material comprising a substrate having an oleophilic surface, a layer containing nitrocellulose and carbon black and a silicon layer. After image-wise exposure using a laser the imaged areas are said to be rendered oleophilic. The silicon layer decomposed on the exposed areas is removed on press. Ink acceptance of the obtained plates is poor and the printing properties such as printing endurance and resolution of the copies is rather poor.

Research Disclosure 19201 of April 1980 discloses a heat sensitive recording material comprising a polyester film support provided with a bismuth layer as a heat sensitive recording layer and a silicon layer on top thereof. The disclosed heat sensitive recording material is imaged using an Argon laser and developed using hexane.

EP-A-573091 discloses a method for making a lithographic printing plate requiring a heat sensitive recording material comprising on a support having an oleophilic surface (i) a recording layer having a thickness of not more than 3 $\mu$m and containing a substance capable of converting the laser beam radiation into heat and (ii) a cured oleophobic surface layer and wherein said recording layer and oleophobic surface layer may be the same layer. The exposed material is processed by a rub-off step.

GB-1 387 542 discloses the preparation of an electrophotographic toner image on a silicon layer. The toner image is thermally fused. There is no mention that the ink accepting phase is a continuous phase.

JP 63-22687 discloses a lithographic printing plate wherein on a support is coated a dispersion layer which contains particles comprising a thermoplastic resin containing fluorine and a binder resin, and a tetrafluoroethylene resin and a polymer of fluorine-containing acrylic acid are adapted to the particles of the thermoplastic resin containing fluorine. It is not disclosed that said binder is ink accepting.

U.S. Pat. No. 4,010,687 discloses a printing master and a method for producing the same which comprises: coating a suitable substrate with a layer of an ink releasable material selected from the group consisting of silicone elastomers and heterophase polymeric compositions. It is not mentioned that the non-silicone phase is a continuous phase.

U.S. Pat. No. 4,686,138 discloses a printing plate for offset printing which comprises a water resistant support and an image receiving layer provided thereon which comprises an inorganic pigment and a mixed binder comprising a water-soluble high polymer compound and a synthetic high polymer latex. It is not mentioned that an ink abhesive phase is present.

WO 97/175 discloses a printing plate including a substrate, an IR absorbing layer comprised substantially of a first water based emulsion and a top IR ablatable layer comprised substantially of a second water based emulsion. It is not disclosed that said top layer consist of two phases.

EP-A 755 803 discloses a lithographic printing plate comprising the non-image area of a hydrophilic swellable layer; being 1 to 50 mg/m$^2$ in water absorbability, and the water absorbability of the image area, being less than that of the non-image area. It is not disclosed that said plate comprises an ink abhesive phase.

U.S. Pat. No. 4,012,254 discloses a process for preparing a nonimage photoconductive waterless lithographic printing master comprising providing a heterogenous copolymer containing an abhesive species of polysiloxane groups and an imaging material adhesive species of organic thermoplastic groups, providing a solvent which will preferentially dissolve one of said species, placing said copolymer in said solvent wherein the non-soluble species forms micelles, providing a photoconductive pigment and dispersing said pigment in the resultant solution, providing a suitable master substrate and coating the resultant suspension on said master substrate, and allowing the solvent to evaporate whereby the soluble species forms the matrix in which the pigment is dispersed. It does not disclose the presence of a ink accepting homogeneous phase.

From the above it can be seen that a number of proposals have been made for making a driographic printing plate using a heat sensitive recording material. All these plates have the disadvantage that they have to be processed or that they are prepared by ablation. In both cases there originates waste in the preparation of said plates. A printing plate prepared by a really wasteless process remains an unanswered wish of the printing industry.

SUMMARY OF THE INVENTION

According to the present invention it is an object to provide an alternative heat sensitive recording material for making a driographic printing plate of high quality that is prepared by a wasteless process.

It is a further object of the present invention to provide a method for obtaining a driographic printing plate of high quality using a heat sensitive recording material that is prepared by a wasteless process.

Further objects of the present invention will become clear from the description hereinafter.

According to the present invention there is provided a heat sensitive recording material having on a support a recording layer containing a homogeneous ink accepting phase and an ink abhesive phase, characterized in that said ink abhesive phase comprises a silicon based polymer.

According to the present invention there is also provided a method for making a lithographic printing plate requiring no dampening liquid comprising the step of:

image-wise exposing to heat or actinic light a heat sensitive recording material as described above.

DETAILED DESCRIPTION OF THE INVENTION

It has been found that the above described heat sensitive recording material yields printing plates without a developing process or without waste, what results in an economical and an ecological benefit.

In the present invention a hydrophilic polymer means that water will adhere to said polymer when coated on a support and brought in contact with a mixture of water and oil. However a layer of such a hydrophilic polymer can adhere to oil when brought in contact with a waterless oily solution. Also in the present invention an oleophilic polymer means that oil will adhere to the polymer when coated on a support and brought in contact with a mixture of water and oil.

In a first embodiment the ink accepting phase comprises a continuous hydrophilic binder, preferably a hardened hydrophilic continuous binder. Suitable hydrophilic binders for use in said embodiment in connection with this invention are water soluble (co)polymers for example synthetic homo- or copolymers such as polyvinylalcohol, a poly(meth)acrylic acid, a poly(meth)acrylamide, a polyhydroxyethyl(meth) acrylate, a polyvinylmethylether or natural binders such as gelatin, a polysaccharide such as e.g. dextran, pullulan, cellulose, arabic gum, alginic acid.

The hydrophilic binder can also be a water insoluble, alkali soluble or swellable resin having phenolic hydroxy groups and/or carboxyl groups.

Preferably the water insoluble, alkali soluble or swellable resin used in connection with the present embodiment of the invention comprises phenolic hydroxy groups. Suitable water insoluble, alkali soluble or swellable resins for use in an image-forming layer in connection with this invention are for example synthetic novolac resins such as ALNOVOL, a registered trade mark of Reichold Hoechst and DUREZ, a registered trade mark of OxyChem and synthetic polyvinylfenols such as MARUKA LYNCUR M, a registered trade mark of Dyno Cyanamid.

A particularly suitable cross-linked hydrophilic layer may be obtained from a hydrophilic binder cross-linked with a cross-linking agent such as formaldehyde, glyoxal, polyisocyanate or a hydrolysed tetra-alkylorthosilicate.

According to this embodiment the ink abhesive phase comprises an ink abhesive latex of a silicon based polymer. The ratio between the amount of ink abhesive latex and oleophilic binder lies in the range between 1:5 to 5:1, more preferably in the range between 1:2 to 2:1.

In a second embodiment the ink accepting phase comprises a latex of an oleophilic polymer. Specific examples of oleophilic polymer latices for use in connection with the present embodiment of the invention are preferably polyvinyl chloride, polyvinylidene chloride, polyacrylonitrile, polyvinyl carbazole etc., copolymers or mixtures thereof. Most preferably used are polystyrene, polymethylmethacrylate or copolymers thereof. Said polymer latex may be hardened.

According to this embodiment the ink abhesive phase comprises also an ink abhesive latex of a silicon based polymer. The ratio between the amount of ink abhesive latex and oleophilic binder lies in the range between 1:10 to 10:1, more preferably in the range between 1:5 to 5:1, most preferably in the range between 1:2 to 2:1.

These two embodiments have the advantage that they can be coated from an aqueous dispersion. In a third embodiment the ink accepting phase comprises a continuous oleophilic binder. Specific examples of oleophilic polymers for use in said binder in connection with the present embodiment of the invention are oleophilic polymers as mentioned above. Said oleophilic binder may be hardened.

According to this embodiment the ink abhesive phase comprises also an ink abhesive latex of a silicon based polymer. The ratio between the amount of ink abhesive latex and oleophilic binder lies in the range between 1:10 to 10:1, more preferably in the range between 1:5 to 5:1, most preferably in the range between 1:2 to 2:1. In this embodiment the coating of the recording layer is applied from an organic solvent for the oleophilic polymer.

The thickness of the recording layer ranges preferably from 0.2 to 25 μm, more preferably from 1 to 10 μm.

The weight average molecular weight of the ink accepting or ink abhesive polymers may range from 5,000 to 1,000,000 g/mol.

The polymer latices may have a particle size from 0.01 μm to 50 μm, more preferably between 0.05 μm and 10 μm and most preferably between 0.05 μm and 2 μm.

The heat sensitive recording material preferably includes a compound capable of converting light to heat. The compound capable of converting light into heat can be present in a layer contiguous to the recording layer but is preferably present in the recording layer. Suitable compounds capable of converting light into heat are more preferably infrared absorbing components although the wavelength of absorption is not of particular importance as long as the absorption of the compound used is in the wavelength range of the light source used for image-wise exposure. Particularly useful compounds are for example dyes and in particular infrared dyes, carbon black, metal carbides, borides, nitrides, carbonitrides, bronze-structured oxides and oxides structurally related to the bronze family but lacking the A component e.g. $WO_{2.9}$. It is also possible to use conductive polymer dispersions such as polypyrrole or polyaniline-based conductive polymer dispersions. It has been found that carbon black yields very good and favorable results.

The support of the heat sensitive recording material may be any support which is suitable for lithographic printing materials. Said support can be a layer having a hydrophilic or a hydrophobic surface such as a polymeric, a metallic or a glass layer.

According to one embodiment of the present invention, the lithographic base has a hydrophilic surface which favourably influences the adhesion of aqueous coated layers. A particularly preferred lithographic base having a hydrophilic surface is an electrochemically grained and anodized aluminum support. According to the present invention, an anodized aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde. It is further evident that one or more of these post treatments may be carried out alone or in combination.

The hydrophobic supports may be opaque or transparent, e.g. a paper support or a resin support. When a paper support is used preference is given to one coated at one or both sides with an alpha-olefin polymer, e.g. a polyethylene layer which optionally contains an anti-halation dye or pigment. Preferably an organic resin support is used e.g. cellulose esters such as cellulose acetate, cellulose propionate and cellulose butyrate; polyesters such as poly(ethylene terephthalate); polyvinyl acetals, polystyrene, polycarbonate; polyvinylchloride or poly-Alpha-olefins such as polyethylene or polypropylene.

One or more subbing layers may be coated between the support and the recording layer for use in accordance with the present invention in order to get an improved adhesion between these two layers.

In order to obtain a lithographic plate the heat sensitive element according to the invention is image-wise heated or exposed to actinic light and is then used as a printing plate without further development.

Heat is preferably applied by a thermal printer.

Actinic light is light that is absorbed by the compound converting light into heat.

Image-wise exposure in connection with the present invention is preferably an image-wise scanning exposure involving the use of a laser or L.E.D. It is highly preferred in connection with the present invention to use a laser emitting in the infrared (IR) and/or near-infrared, i.e. emitting in the wavelength range 700–1500 nm. Particularly preferred for use in connection with the present invention are laser diodes emitting in the near-infrared.

In heat sensitive recording materials according to the first and third embodiment the exposed areas become ink abhesive while the unexposed areas remain ink accepting. In the second embodiment depending on the amount of oleophilic latices in regard to the amount of ink abhesive latices the exposed areas become ink abhesive while the unexposed areas remain ink accepting or the exposed areas become ink accepting while the unexposed areas remain ink abhesive.

The following examples illustrate the present invention without limiting it thereto. All parts are by weight unless otherwise specified.

EXAMPLE 1

An aqueous dispersion is prepared by mixing 27.2 g of a 5.5% polyvinyl alcohol solution with 3.0 g of a 50% silicone emulsion (Dehesive 410 E from Wacker-Chemie GmbH, Germany) and 0.62 g of a 37% of a methyl hydrogen siloxane crosslinking agent (V 72 from Wacker-Chemie GmbH, Germany). This dispersion is made up with water to a final volume of 50 ml, coated on a subbed PET polyester support with a coating knife to a wet thickness of 50 μm and dried during 2 hours at a temperature of 50° C.

A positive image is formed by image-wise heating this material with a thermal printer (DRYSTAR ITT 917 from Agfa-Gevaert N.V., Belgium) with an output level of 67 mW. This imaged material is used as such as a waterless printing plate on an AB DICK 9860 printing press using a Hostman-Steinberg Reflecta Dry ink (magenta). Up to 100 copies of the image were satisfactorily printed.

EXAMPLE 2

An aqueous dispersion is prepared by mixing 2.5 g of a 20% polystyrene dispersion with 4.0 g of a 50% silicone emulsion (Dehesive 410 E from Wacker-Chemie GmbH, Germany), 0.81 g of a 37% of a methyl hydrogen siloxane crosslinking agent (V 72 from Wacker-Chemie GmbH, Germany) and 0.12 g of an infrared absorbing dye with the following formula:

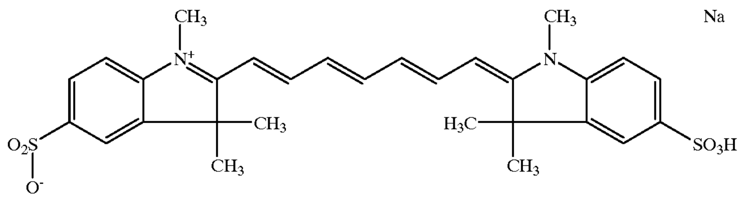

The dispersion is made up with water to a total volume of 20 ml and well mixed. The dispersion is coated with a coating knife on a PET polyester support at a wet thickness of 20 μm and dried at a temperature of 60° C. during 10 minutes.

An image is formed with an external drum diode laser (830 nm) with an output level of 305 mW and a drumspeed of 8 m/s. The negative image material is used as a waterless printing plate on an AB DICK 9860 printing press using a Hostman-Steinberg Reflecta Dry ink (magenta). Up to 100 copies of the image were satisfactorily printed.

We claim:

1. A method for making a lithographic printing plate requiring no dampening liquid comprising the steps of:

preparing a heat sensitive recording material having on a support a recording layer containing a homogeneous ink accepting phase and an ink abhesive phase, characterized in that said ink abhesive phase comprises a silicon based polymer, and image-wise heating or exposing to actinic light said heat sensitive recording material, wherein said method is carried out in the absence of a toner.

2. A method for making a lithographic printing plate requiring no dampening liquid according to claim 1 wherein said ink accepting phase comprises a continuous hydrophilic binder.

3. A method for making a lithographic printing plate requiring no dampening liquid according to claim 2 wherein said continuous hydrophilic binder is a hardened hydrophilic continuous binder.

4. A method for making a lithographic printing plate requiring no dampening liquid according to claim 1 wherein said ink accepting phase comprises a latex of an oleophilic polymer.

5. A method for making a lithographic printing plate requiring no dampening liquid according to claim 1 wherein said ink accepting phase comprises a continuous oleophilic binder.

6. A method for making a lithographic printing plate requiring no dampening liquid according to claim 1 wherein said ink abhesive phase is an ink abhesive latex.

7. A method for making a lithographic printing plate requiring no dampening liquid according to claim 1 wherein said heat sensitive recording material includes a compound capable of converting light into heat.

8. A method for making a lithographic printing plate requiring no dampening liquid according to claim 1 wherein the recording layer includes a compound capable of converting light into heat.

* * * * *

UNITED STATES PATENT AND TRADEMARK OFFICE

CERTIFICATE OF CORRECTION

PATENT NO. : 6,093,519

DATED : July 25, 2000

INVENTOR(S) : Ludo Van Rompuy et al

It is certified that error appears in the above-indentified patent and that said Letters Patent is hereby corrected as shown below:

Column 7, claim 1, line 13, "toner" should read -- developing step --.

Signed and Sealed this

Seventeenth Day of April, 2001

Attest:

NICHOLAS P. GODICI

*Attesting Officer*

*Acting Director of the United States Patent and Trademark Office*